(12) United States Patent
Yamauchi et al.

(10) Patent No.: US 6,201,762 B1
(45) Date of Patent: Mar. 13, 2001

(54) EPROM CIRCUIT WITH ERROR CORRECTION

(75) Inventors: Shigenori Yamauchi, Nisshin; Seiki Aoyama, Toyohashi, both of (JP)

(73) Assignee: Denso Corporation, Kariya (JP)

(*) Notice: Subject to any disclaimer, the term of this patent is extended or adjusted under 35 U.S.C. 154(b) by 0 days.

(21) Appl. No.: 09/593,964

(22) Filed: Jun. 15, 2000

(30) Foreign Application Priority Data

Jun. 16, 1999 (JP) .................................................. 11-169794

(51) Int. Cl.$^7$ .................................................. G11C 16/00
(52) U.S. Cl. ........................ 365/285.09; 365/94; 365/103
(58) Field of Search ................................. 365/185.09, 94, 365/103, 104

(56) References Cited

U.S. PATENT DOCUMENTS

| | | | |
|---|---|---|---|
| 5,581,501 | * 12/1996 | Sansbury et al. | 365/94 |
| 5,742,540 | * 4/1998 | Wakasugi et al. | 365/94 |
| 5,812,450 | * 9/1998 | Sansbury et al. | 365/94 |

FOREIGN PATENT DOCUMENTS

| | | |
|---|---|---|
| 57-143656 | 9/1982 | (JP) . |
| 58-70497 | 4/1983 | (JP) . |
| 62-192837 | 8/1987 | (JP) . |
| 9-284266 | 10/1997 | (JP) . |

\* cited by examiner

*Primary Examiner*—Tan T. Nguyen
(74) *Attorney, Agent, or Firm*—Law Office of David G. Posz

(57) ABSTRACT

To correct an unintentionally erasing error in an EPROM circuit, in accordance with the same one-bit data, each of first and second EPROM cells is either unprogrammed to output a first logic value representing an unprogrammed condition when reading or programmed to output a second logic value representing a programmed condition when reading. A logic operation gate outputs the first logic value when both the first and second EPROM cells output the first logic value and outputting the second logic value when at least one of the first and second EPROM cells output the second logic value. To correct unintentionally writing error in an N-bit EPROM circuit, a first parity is stored and a second parity is detected from N logic operation gates. If the first parity disagrees with the second parity, a correction signal is generated. In the presence of the correction signal, when it is detected at each of N-bit that an output of the first EPROM cell disagrees with that of the second one, an inverted output of the logic operation gate at the bit instead the output of the logic operation gate.

3 Claims, 2 Drawing Sheets

EPROM CIRCUIT WITH ERROR CORRECTION

BACKGROUND OF THE INVENTION

1. Field of the Invention

This invention relates to an EPROM circuit with error correction.

2. Description of the Prior Art

Generally, in EPROMs (Electrically Programmable Read-Only Memory), there is a possibility of occurrence of the unintentionally erasing error due to dispersion in the data maintaining interval of each memory cell (EPROM cell) or noise. That is, bit data may changes from the logic value representing the programmed condition to the logic value representing the unprogrammed condition. Moreover, there is the unintentionally writing error wherein the logical value representing the unprogrammed condition to the unprogrammed condition, though the probability of occurrence of unintentionally writing error is lower than the unintentionally erasing error.

To prevent these errors, an EPROM circuit with correction adopting three-bit majority determination method has been proposed. Japanese patent application provisional publication No. 57-143656 discloses such a prior art EPROM circuit with correction.

FIG. 2 is a block diagram of such a prior art EPROM circuit.

The EPROM circuit of this prior art including a plurality of bit (storing) circuits having output lines, respectively, each including three EPROM cells MA, MB, and MC and a majority determining circuit for determining majority among output values of three EPROM cells MA, MB, and MC and outputting the majority result. The majority is determined such that the same value which is outputted from more than one of the EPROMs is determined as majority.

The majority determining circuit T includes three two-input NOR gates 1 to 3 and three-input NOR gate 4 of which output is connected to each of outputting lines OUT(1) to OUT(n).

In this EPROM circuit with error correction, if more than one outputs of three EPROMs MA, MB, MC are correct, the value can be judged correct.

For example, values stored in the EPROMs MA, MB, MC change from "1, 1, 1" (correct logic values) to either of "0, 1, 1", "1, 0, 1", or "1, 1, 0", all inputs of the three-input NOR gate 4 remains "0", because there is no two-input NOR gate of which both inputs are supplied with "0". Therefore, the correct value of "1" is outputted from the three-input NOR gate 4.

Inversely, values stored in the EPROMs MA, MB, MC change from "0, 0, 0" (correct logic values) to either of "1, 0, 0", "0, 1, 0", or "0, 0, 1" due to the unintentionally writing error, there is at least one of two-input NOR gate of which both inputs remains "0", so that the two-input NOR gate still supplies "1" to the three-input NOR gate 4. Thus, the three-input NOR gate 4 outputs correct value of "0". In this prior art, three EPROMs were necessary for each bit.

SUMMARY OF THE INVENTION

The aim of the present invention is to provide a superior EPROM circuit.

According to the present invention, a first aspect of the present invention provides an EPROM circuit comprising: first and second EPROM cells, in accordance with the same one-bit data, each either being unprogrammed to output a first logic value representing an unprogrammed condition when reading or being programmed to output a second logic value representing a programmed condition when reading; and logic operation means for outputting the first logic value when both the first and second EPROM cells output the first logic value and outputting the second logic value when at least one of the first and second EPROM cells output the second logic value.

The logic operation means outputs the second logic value indicating the programmed condition with priority to the first logic value representing the unprogrammed condition. An OR gates can be used as the logic operation means if the first logic value is "0" and the second logic value is "1". On the other hand, an AND gates can be used as the logic operation means if the first logic value is "1" and the second logic value is "0".

According to this EPROM circuit, though an unintentional erasing error occurs in either of EPROM cells, that is, though the output of the EPROM cell changes from the second logic value to the first logic value, the correct second logic value is outputted, so that the unintentional erasing error can be corrected.

In the first aspect, it is considered that a probability of occurrence of the unintentional erasing error is higher than that of the unintentional writing error. Thus, if either of two EPROM cells outputs the second logic value indicating the programmed condition, the correct second logic value is outputted. If both EPROM cells output the first logic value (unprogrammed condition), the logic operation means outputs the first logic value.

According to the present invention, a second aspect of the present invention provides an EPROM circuit comprising: N storing circuits for storing N-bit data, each including: first and second EPROM cells, in accordance with the same one-bit data, each either being unprogrammed to output a first logic value representing an unprogrammed condition when reading or being programmed to output a second logic value representing a programmed condition when reading; and logic operation means for outputting the first logic value when both the first and second EPROM cells output the first logic value and outputting the second logic value when at least one of the first and second EPROM cells output the second logic value; inverting means for inverting an output of the logic operation means; disagreement detection means for detecting disagreement between the outputs of the first and second EPROM cells; and switching means for outputting either of outputs of logic operation means or the inverting means; parity data storing means for storing a first parity of the N-bit data; parity detecting means for detecting a second parity of N of the logic operation means; and agreement detection means for detecting agreement between the first and second parties, each of the switching circuit outputting the output of the logic gate means when the agreement detection means detects the agreement and outputting the output of the inverting means when the agreement detection means does not detect the agreement and the disagreement detection means detects the disagreement, N being a natural number.

Preferably, the parity data storing means may comprise third to fifth EPROM cells, each either being programed or being unprogrammed in accordance with the parity data. The EPROM circuit may further comprise majority detection means for detecting majority among outputs of the third to fifth EPROM cells. The agreement detection means detects the agreement with majority result as the first parity.

To correct an unintentionally writing error, first disagreement between the first parity and the second parity is detected. Moreover, second disagreement between outputs of the first and second EPROM cells is detected in the N storing circuits.

In the presence of the unintentionally writing error, the logic value of the logic operation means at the mth storing circuit changes from "0" to "1", so that the second parity changes from the original value. Thus, the second parity disagrees with the first parity, so that a correction signal is outputted.

In the presence of the correction signal, one of the N storing circuits in which there is the second disagreement is detected. The output of the logic operation means of the detected storing circuit is inverted so that the unintentionally writing error is corrected.

The first parity is stored in another EPROM circuit including three EPROM cells storing the same parity data. A majority determining means determines majority of outputs in three EPROM cells. Each of the first and second parities indicates that the number of the logic values "1" in the N bit data or the N bit outputs of the logic operation means is even or odd.

BRIEF DESCRIPTION OF THE DRAWINGS

The object and features of the present invention will become more readily apparent from the following detailed description taken in connection with the accompanying drawings in which.

The same or corresponding elements or parts are designated with like references throughout the drawings.

DETAILED DESCRIPTION OF THE INVENTION

Figure 1:
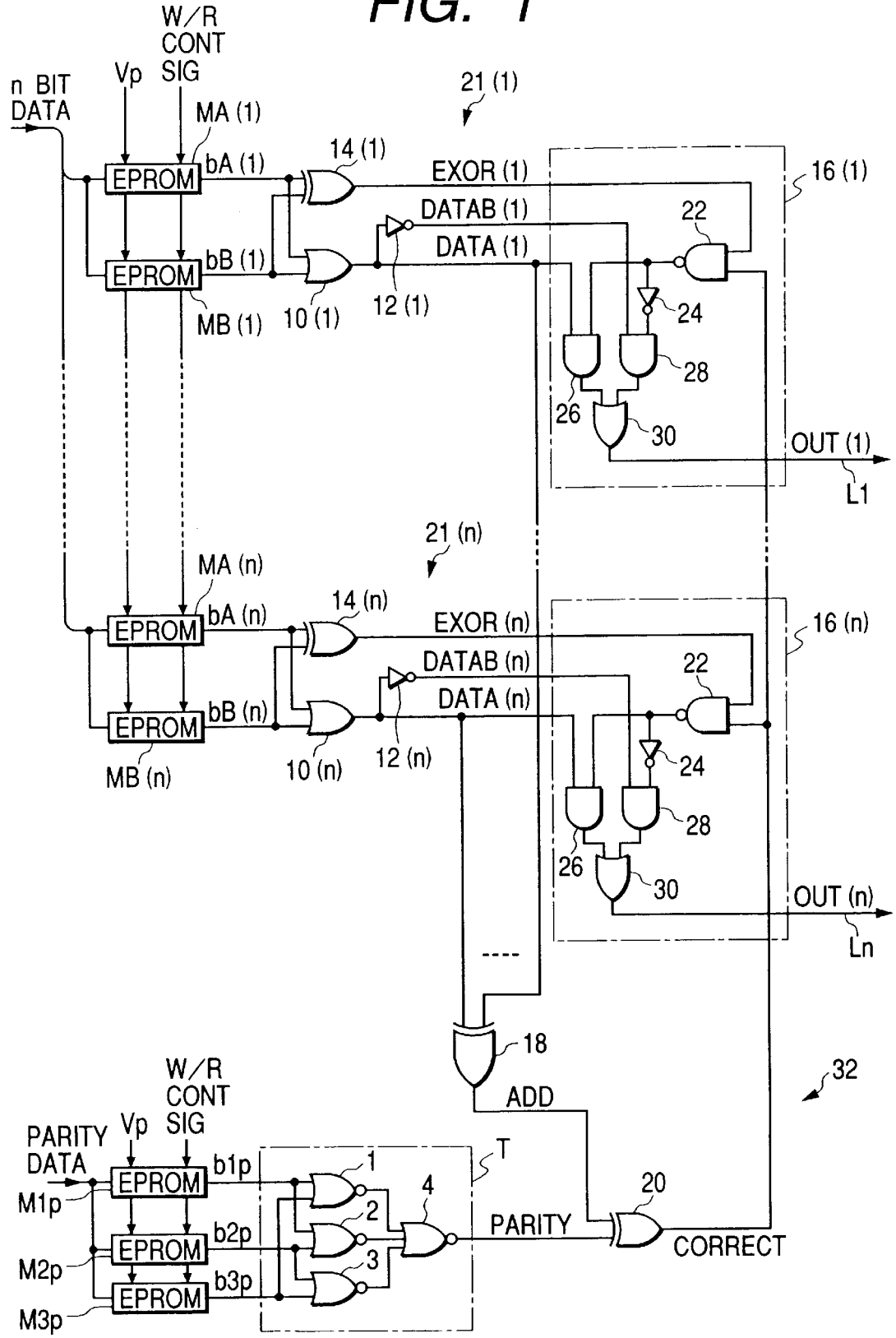
FIG. 1 is a block diagram of an EPROM circuit with error correction according to an embodiment of this invention.
Figure 2:
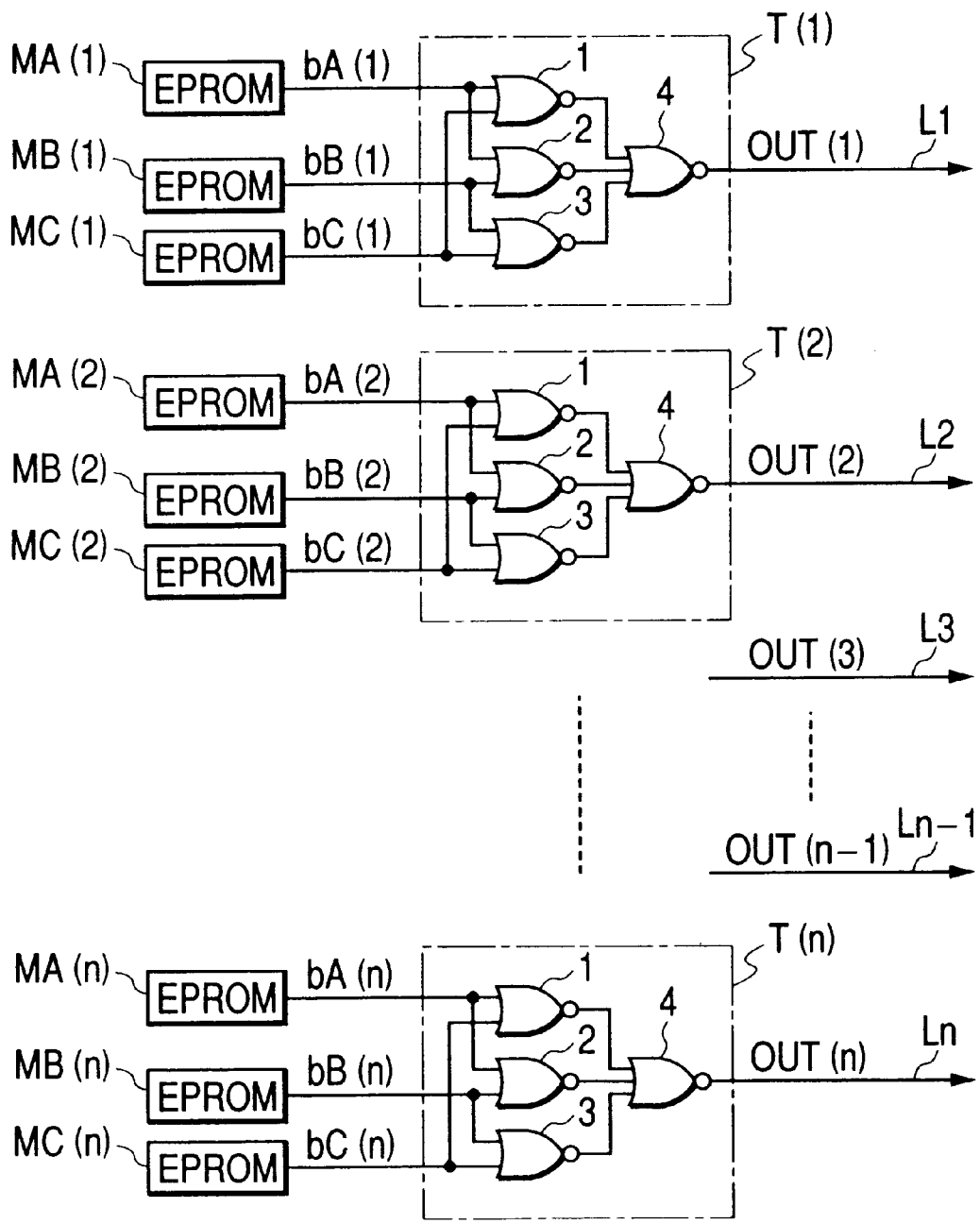
FIG. 2 is a block diagram of a prior art EPROM circuit.

FIG. 1 shows a block diagram of an EPROM circuit with error correction according to an embodiment of this invention. In this embodiment, each EPROM cell stores one bit data, wherein the first logic value to "0" indicates an unprogrammed condition of each EPROM cell (memory cell) and the second stored (outputted) logic value "1" indicates a programmed condition of each EPROM cell.

The EPROM circuit according to this embodiment includes first to $n^{th}$ bit (storing) circuits 21(1) to 21(n) for storing and outputting N bit data at corresponding data output lines, respectively and a parity error detection circuit 32.

Each of bit circuits 21(1)–21(n), that is, the $m^{th}$ bit circuit 21(m) includes a pair of EPROM cells MA(m) and MB(m) in which the same one bit data is written, an OR gate 10(m) supplied with outputs bA(m) and bB(m) of the EPROMs MA(m) and MB(m), an inverter 12(m) for inverting an output DATA(m) of the OR gate 10(m), an EXCLUSIVE OR gate 14(m) supplied with the outputs bA(m) and bB(m) of the EPROMs MA(m) and MB(m) for detecting disagreement between outputs of the EPROMs MA(m) and MB(m), a switch circuit 16(m) for outputting either of the output DATA(m) of the OR gate 10(m) or an output DATAB(m) of the inverter 12(m) in accordance with an output EXOR(m) of the EXCLUSIVE OR gate 14(m) and a correct signal CORRECT, and an output line OUT for outputting an output of the switch circuit 16(m).

In FIG. 1, the number in parentheses attached to each reference represents correspondence with corresponding one of the output lines OUT(1) to OUT(n), wherein n and m are natural numbers, $1 \leq m \leq n$.

The parity error detection circuit 32 includes a set of three EPROM cells M1p, M2p, and M3p in which the same parity data (first parity) of the n bits data supplies to the bit circuits 21(1) to 21(n) is written, a majority determining circuit T for determining majority among outputs of the EPROM cells M1p to M3p and outputting a parity PARITY, an adder 18 for effecting one-bit addition operation among outputs DATA(1) to DATA(n) of the OR gates 10(1) to 10(n) wherein carry bits are neglected to detect a second parity ADD of outputs DATA A of the OR gates 10(1) to 10(n), and an EXCLUSIVE OR gate 20 for detecting agreement between the second parity and parity PARITY to supply the correct signal CORRECT to switch circuits 21(1) to 21(n).

The parity data written in the EPROM cells M1p to M3p is previously generated in accordance with the rule as follows:

The number of digits having the logic value of "1" in the n bit data is detected. If the number is even, a logic value of "0" is generated as the parity data. If the number is odd, a logic value of "1" is generated as the parity data.

The generated parity data is written in EPROM cells M1p to M3p with a programing voltage Vp in response to the read/write control signal.

The majority determining circuit T includes three two-input NOR gates 1 to 3 and a three-input NOR gate 4. The two-input NOR gate 1 is supplied with an output b1p of the EPROM cell M1p and an output b3p of the EPROM cell M3p. The two-input NOR gate 2 is supplied with the output b1p of the EPROM cell M1p and an output b2p of the EPROM cell M2p. The two-input NOR gate 3 is supplied with the output b2p of the EPROM cell M2p and the output b3p of the EPROM cell M3p. Outputs of the two-input NOR gates 1 to 3 are supplied to the three-input NOR gate 4. The parity PARITY of the three-input NOR gate 4 is supplied to the EXCLUSIVE OR gate 20.

In this majority determining circuit T, if more than one outputs of three EPROM cells M1p, M2p, and M3p are correct, that logic value is judged to be correct.

For example, logic values stored in three EPROM cells M1p, M2p, and M3p change from "1, 1, 1" (correct logic values) to either of "0, 1, 1,", "1, 0, 1", "1, 1, 0", all inputs of the three-input NOR gate 4 remain "0" because there is no two-input NOR gate of which both inputs are "0". Therefore, the correct logic value of "1" is outputted from the three-input NOR gate 4.

On the other hand, if the logic values stored in three EPROMs M1p, MB2p M3p change from "0, 0, 0" (correct logic values) to either of "1, 0, 0", "0, 1, 0, 1", or "0, 0, 1" due to the unintentionally writing error, there is at least one of two-input NOR gate of which both inputs remains "0", so that the two-input NOR gate supplies "1" to the three-input NOR gate 4. Thus, the three-input NOR gate 4 outputs correct logic value of "0".

Each of the switch circuits 21(1) to 21(n), that is, the $m^{th}$ switch circuit 21(m), includes a NAND gate 22 for detecting agreement between outputs of the EXCLUSIVE OR 20 and the EXCLUSIVE OR 14(m), an inverter 24 for inverting an output of the NAND gate 22, an AND gate 26 for outputting the output DATA(m) of the OR gate 10(m) in response to the NAND gate 22, an AND gate 28 for outputting the output DATAB(m) from the inverter 12(m) in response to the inverter 24, and an OR gate 30 for outputting outputs of the AND gates 26 and 28 at the data output line L(m).

Each digit (bit) of n bit data is written in each pair of EPROM cells MA and MB with the programing voltage Vp in response to the writing/reading control signal. In addition, the parity data generated in accordance with the n bit data is written in the EPROM cells M1p to M3p at the same time with the programing voltage in response to the writing/reading control signal.

In each bit circuit 21(m), the OR gate 10(m) outputs the logic value of "0" if both outputs bA(m) and bB(m) of the EPROM cells MA(m) and MB(m) are "0" indicating the unprogrammed condition. Moreover, if at least one of outputs bA(m) and bB(m) of the EPROM cells MA(m) and MB(m) is "1" indicating the programed condition, the OR gate 10(m) outputs one bit data of "1". $1 \leq k \leq n$.

In each bit circuit 21(m), the inverter 12(m) inverts the output DATA(m) of the OR gate 10(m).

In each bit circuit 21(m), the EXCLUSIVE OR gate 14(m) outputs the logic value of "0" if both outputs bA(m) and bB(m) of the EPROM cells MA (m) and MB(m) agree with each other. Moreover, if both outputs bA(m) and bB(m) of the EPROM cells MA(m) and MB(m) disagree with each other, that is, if the unintentionally erasing error or the unintentionally writing error occurs in either of the EPROM 10 cells MA(m) or MB(m), the EXCLUSIVE OR gate 14(m) outputs one bit data of "1".

In each bit circuit 21(m), the switching circuit 16(m) outputs the output DATAB(m) of the inverter 12(m) if the output EXOR(m) of "1" indicating disagreement and the EXCLUSIVE OR gate 20 outputs "1" (CORRECT). In other cases, the switching circuit 16(m) outputs the output DATA (m) of the OR gate 10(m) at the corresponding data output line OUT(m).

On the other hand, in the parity error detection circuit 32, the adder 18 effects one-bit addition operation among outputs DATA(1) to DATA(n) of the OR gates 10(1) to 10(n). That is, the adder 18 outputs the logic value "0" when the number of digits of which logic values are "1" is even and outputs the logic value "1" when the number of digits of which logic values are "1" is odd.

Thus, though either of values in the unprogrammed EPROM cells MA(m) and MB(m) changes from "0" to "1" due to an unintentional programming error, the output CORRECT of the EXCLUSIVE OR gate 20 changes from "0" to "1" indicating the correction signal.

The switch circuit 16(m) outputs the output DATAB(m) from the inverter 12(m) at the data output line OUT(m) when both of outputs of the EXCLUSIVE OR 20 and the EXCLUSIVE OR 14(m) indicate "1". On the other hand, if either of outputs of the EXCLUSIVE OR 20 or the EXCLUSIVE OR 14(m) indicate "0", the switch circuit 16(m) outputs the output DATA(m) of the OR gate 10(m) at the data output line OUT(m).

According to the above-mentioned structure, the unintentionally erasing error is corrected.

A concrete example of correcting the unintentionally erasing error will described.

It is assumed that values in either of the EPROM cells MA(m) and MB(m) changes from "1" to "0". The output value of the OR gate 10(m) remains "1". Thus, the number of "1" of the outputs of the OR gates 10(1) to 10(n) also does not change. Accordingly, the output ADD of the adder 18 agrees with the output PARITY of the majority determining circuit T. Thus, the correction signal CORRECT is not outputted from the EXCLUSIVE OR 20, so that the switch circuit 16(m) outputs the output DATA(m) ("1") at the output data line OUT(m).

Moreover, according to the above-mentioned structure, the unintentionally writing error is corrected because the switch circuit 16 (m) selects the output DATAB (m) of the inverter (m) as the output at the data output line OUT(m).

A concrete example of correcting the unintentionally writing error will described.

It is assumed that values in either of the EPROM cells MA(m) and MB(m) changes from "0" to "1". The value of the OR gate 10(m) changes from "0" to "1". Then, the number of the logic value "1" at the outputs DATA(l) to DATA(n) of the OR gates 10 (1) to (n) increases by one, so that the EXCLUSIVE OR gate 20 outputs "1" indicating correction because when there is no error the second parity outputted from the adder 18 should agree with the first parity from the majority circuit T. AN EPROM CIRCUIT WITH ERROR CORRECTION On the other hand, the EXCLUSIVE OR 14(m) outputs "1" because the output values of the EPROM cells MA(m) and MB(m) are different from each other. Then, the NAND gate 22 of the switch circuit 16(m) outputs "0" because both input are supplied with "1". Thus, the switch circuit 16(m) outputs the output DATAB(m) of the inverter 12(m) at the output data line OUT(m). Accordingly, the unintentionally writing error is corrected.

In addition, if there is no error in the EPROM cells MA(m) and MB(m), the OR gate 10(m) outputs the logic value corresponding to the originally stored values. This logic value is outputted at the data output line OUT (m) as it is because the EXCLUSIVE OR 14(m) outputs "0". That is, the original data stored in the EPROM cells MA(m) and MB(m) is outputted at the data output line OUT(m).

As mentioned above, only two EPROM cells MA(m) and MB(m) are provided to each bit circuit 21(m) to correct the unintentionally erasing error and the unintentionally writing error is corrected by the parity error detection circuit 32 and the switch circuits 16(1) to 16(n). Thus, the circuit scale is reduced.

In this embodiment, each of EPROM cells MA(n), MB(n), M1p, M2p, and M3p is supplied with the programming voltage Vp, the writing/reading control signal W/R CONT SIG, and supply voltage (not shown). The writing/reading control signal W/R CONT SIG includes an address signal (if a number of bit data is stored), a chip selection signal, a write/read enable signal, and a write/read command. Moreover, each of EPROM cells MA(n), MB(n), M1p, M2p, and M3p includes an EPROM element, a circuit for supplying the programming voltage to the EPROM element, and a circuit for writing and reading in response to the writing/reading control signal W/R CONT SIG. Programming is effected by supplying the programming voltage in addition to the supply voltage in response to the writing/reading control signal. Reading is effected in response to the writing/reading control signal with supplying of the supply voltage.

In EPROM cells, generally, the probability of occurrence of the unintentionally erasing error is higher than that of the unintentionally writing error. In consideration of this fact, a modification is provided.

That is, only the error correction function for the unintentional erasing error is provided.

In this modification, the inverters 12(1) to 12(n), the EXCLUSIVE ORs 14(1) to 14(n), the switch circuits 16(1) to 16(n), the parity error detection circuit 32 including the EPROM cells M1p, M2p, M3p, the majority determining circuit T, the adder 18, and the EXCLUSIVE OR 20 are omitted and the outputs of OR gates 10(1) to 10(n) are directly connected to the data output lines OUT(1) to OUT(n), respectively.

According to this modification, though the unintentional erasing error occurs at either of the EPROM cells MA(m) and MB(m), that is, either of the outputs of the EPROM cells MA(m) and MB(m) changes from "1" to "0", the OR gate 10(m) correctly outputs the stored logic value at the data output line OUT(m). Thus, a sufficient error correction for the unintentional erasing error is provided with a small scale of the circuit.

In the above-mentioned embodiment and the modification, there are various further modification.

For example, in the above-mentioned embodiment and the modification, if the first logic value representing the unprogrammed condition is "1" and the second logic value is "0", the OR gates 10(1) to 10(n) are replaced with AND gates.

What is claimed is:

1. An EPROM circuit comprising:
    first and second EPROM cells, in accordance with the same one-bit data, each either being unprogrammed to output a first logic value representing an unprogrammed condition when reading or being programmed to output a second logic value representing a programmed condition when reading; and
    logic operation means for outputting said first logic value when both said first and second EPROM cells output said first logic value and outputting said second logic value when at least one of said first and second EPROM cells output said second logic value.

2. An EPROM circuit comprising:
    N storing circuits for storing N-bit data, each including:
        first and second EPROM cells, in accordance with the same one-bit data, each either being unprogrammed to output a first logic value representing an unprogrammed condition when reading or being programmed to output a second logic value representing a programmed condition when reading; and
        logic operation means for outputting said first logic value when both said first and second EPROM cells output said first logic value and outputting said second logic value when at least one of said first and second EPROM cells output said second logic value
    inverting means for inverting an output of said logic operation means;
    disagreement detection means for detecting disagreement between said outputs of said first and second EPROM cells; and
    switching means for outputting either of outputs of logic operation means or said inverting means;
    parity data storing means for storing a first parity of said N-bit data;
    parity detecting means for detecting a second parity of N of said logic operation means; and
    agreement detection means for detecting agreement between said first and second parties, each of said switching circuit outputting said output of said logic gate means when said agreement detection means detects said agreement and outputting said output of said inverting means when said agreement detection means does not detect said agreement and said, disagreement detection means detects said disagreement, N being a natural number.

3. An EPROM circuit as claimed in claim 2, wherein said parity data storing means comprises third to fifth EPROM cells, each either being programed or being unprogrammed in accordance with said parity data, said EPROM circuit further comprising majority detection means for detecting majority among outputs of said third to fifth EPROM cells, said agreement detection means detects said agreement with majority result as said first parity.

* * * * *